United States Patent [19]
Wojnarowski

[11] Patent Number: 6,092,280
[45] Date of Patent: *Jul. 25, 2000

[54] FLEXIBLE INTERFACE STRUCTURES FOR ELECTRONIC DEVICES

[75] Inventor: Robert John Wojnarowski, Ballston Lake, N.Y.

[73] Assignee: General Electric Co., Schenectady, N.Y.

[*] Notice: This patent is subject to a terminal disclaimer.

[21] Appl. No.: 09/318,952

[22] Filed: May 26, 1999

Related U.S. Application Data

[60] Division of application No. 08/922,018, Sep. 2, 1997, Pat. No. 5,938,452, which is a continuation-in-part of application No. 08/781,972, Dec. 23, 1996, Pat. No. 5,900,674.

[51] Int. Cl.[7] .......................... H01R 43/00; H01L 23/40; H01L 23/498

[52] U.S. Cl. .................. 29/829; 439/66; 439/67; 174/254; 428/209; 428/901; 427/455; 427/456; 427/96; 427/97; 427/99; 427/123; 427/124; 427/125; 427/191; 427/192; 427/404; 264/139; 264/145; 264/154; 264/155; 264/156; 216/13; 216/17; 216/56; 216/65; 216/72; 29/832

[58] Field of Search .................. 439/66, 67; 174/254; 428/209, 901; 427/455, 456, 96, 97, 99, 123, 124, 125, 191, 192, 402; 264/139, 145, 154, 155, 156; 216/13, 17, 56, 65, 72; 29/829, 832

[56] References Cited

U.S. PATENT DOCUMENTS

| | | | |
|---|---|---|---|
| 4,628,406 | 12/1986 | Smith et al. | 361/386 |
| 4,641,222 | 2/1987 | Derfiny et al. | 361/403 |
| 4,845,542 | 7/1989 | Bezuk et al. | 257/737 |
| 4,847,146 | 7/1989 | Yeh et al. | 428/332 |
| 4,874,721 | 10/1989 | Kimura et al. | 29/830 |
| 5,352,926 | 10/1994 | Andrews | 257/717 |
| 5,473,119 | 12/1995 | Rosenmayer et al. | 174/255 |
| 5,502,002 | 3/1996 | Wong et al. | 437/182 |

FOREIGN PATENT DOCUMENTS

| | | |
|---|---|---|
| 0277606 | 8/1988 | European Pat. Off. . |
| 0407103 | 1/1991 | European Pat. Off. . |
| 3129568 | 4/1982 | Germany . |

*Primary Examiner*—Frederick Krass
*Attorney, Agent, or Firm*—Ann M. Agosti; Jill M. Breedlove

[57] ABSTRACT

A flexible film interface includes a flexible film; flexible material attached to a portion of the flexible film; surface metallization on the flexible material, the flexible film having at least one via extending therethrough to the surface metallization; and a floating pad structure including floating pad metallization patterned over the flexible material and the surface metallization, a first portion of the floating pad metallization forming a central pad and a second portion of the floating pad metallization forming at least one extension from the central pad and extending into the at least one via.

8 Claims, 3 Drawing Sheets

FLEXIBLE INTERFACE STRUCTURES FOR ELECTRONIC DEVICES

CROSS REFERENCE TO RELATED APPLICATION

This application is a divisional of U.S. Ser. No. 08/922,018, filed Sep. 2, 1997 and now U.S. Pat. No. 5,938,452, which is a continuation-in-part of U.S. Ser. No. 08/781,972, filed Dec. 23, 1996 and now U.S. Pat. No. 5,900,674.

The invention was made with Government support under contract number F29601-92-C-0137 awarded by the United States Air Force.

BACKGROUND OF THE INVENTION

Ball grid array (BGA) technology provides a high density of interconnections per unit area, but mismatches of coefficients of thermal expansion (CTEs) occur when ceramic or polymer BGA substrates and printed circuit boards are joined and often result in cracked solder joints, especially as the size of the substrates and temperature ranges are increased. In column grid array (CGA) techniques and other BGA techniques, a eutectic solder is applied to printed circuit board and multi-chip module array pads and the resulting joint is soldered to a higher temperature solder column or ball which does not melt. Both BGA and CGA structures can be inflexible and vulnerable to damage. For various types of BGA and CGA, increases in reliability are attempted by elaborate under-filling of the structures with polymer glues to reinforce the interfaces and reduce the effects of the CTE mismatch on the solder joints. The polymer glues, however, impair repairability because of the difficulty in removing the glues after hardening. Furthermore, these types of structures require two separate solder steps, are more expensive than conventional solder structures, and require more vertical space due to increased height of the joints.

One conventional micro ball grid array interface technique for attaching a semiconductor circuit chip directly to a substrate is to use a series of solder bumps clustered at the center of the chip to constrain the area over which stresses between differing coefficients of thermal expansion occur. In this embodiment, chips have their pads reconfigured and solder micro bumps are applied over the reconfigured pads. In one embodiment, ball grid array processes are used with the temperature range being constrained during device operation to 30° C. to 70° C. in an effort to avoid CTE stress effects. In another ball grid array interface technique, the area where the chip faces the printed circuit board or substrate is not used for direct interconnection. Instead, metallization is routed from the chip to adjacent support structures which then have solder ball connections. This technique can create size and pin count limitations as well as electrical parasitic effects.

Aforementioned U.S. application Ser. No. 08/781,972, now U.S. Pat. No. 5,900,674 describes an interface including a surface having an electrically conductive pad; a compliant coating over the surface having a via extending to the pad; metallization patterned over the compliant coating and extending into the via; a low modulus dielectric interface layer overlying the compliant coating and having an interface via extending to the metallization; and a floating pad structure including floating pad metallization patterned over the dielectric interface layer with a first portion forming a central pad and a second portion forming an extension from the central pad extending into the interface via. The "floating pad" structure is used to increase reliability by providing stress and thermal accommodation of the two materials and permitting movement of the floating pad independent of the base pad. The extension provides stress relief for different coefficients of thermal expansion. The floating pad interface structures can include a single pad and extension or several extensions in situations wherein a single extension is not sufficient for extreme thermal stress/strain situations. The resulting structure accommodates thermal and material stresses without submitting the via interconnect areas to forces that can crack vias or break connections at the pads. The floating pads permit movement independent of a base surface underlying the pads while providing electrical interconnections through selected materials that are specifically patterned to provide low forces at the via areas and thus accommodate differential thermal stresses which may be caused by large CTE differences.

SUMMARY OF THE INVENTION

It would be desirable to additionally have a more flexible interface structure for electronic devices that does not require an underlying base surface and that can be used for relieving stress from structures such as multi-chip modules (MCMs), wafers, individual dies or chips, microelectromechanical structures (MEMs), printed circuit boards, and surface mount technologies which may be caused from coefficient of thermal expansion mismatches with connections such as those formed by ball grid arrays, micro ball grid arrays, column grid arrays, flip chips, solder joints, or tape automated bonding connections.

In one embodiment of the present invention, a flexible film interface includes a flexible film; flexible material attached to a portion of the flexible film; surface metallization on the flexible material, the flexible film having at least one via extending therethrough to the surface metallization; and a floating pad structure including floating pad metallization patterned over the flexible material and the surface metallization, a first portion of the floating pad metallization forming a central pad and a second portion of the floating pad metallization forming at least one extension from the central pad and extending into the at least one via.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF THE INVENTION

Figure 1:
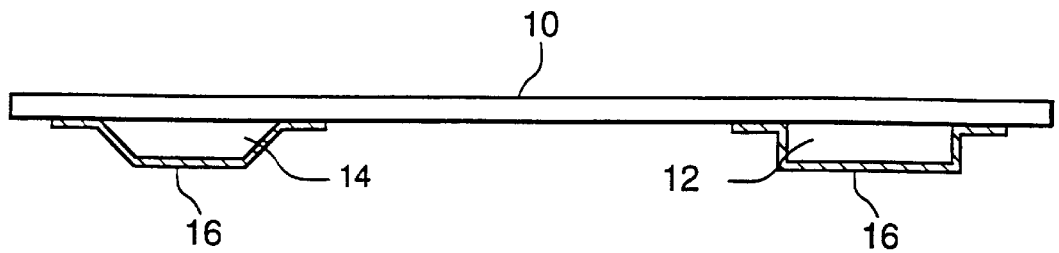
FIG. 1 is a sectional side view of a flexible film having attached thereto flexible material with surface metallization.

FIG. 1 is a sectional side view of a flexible film 10 having attached thereto flexible material 12 and 14 with surface metallization 16. The flexible film 10 preferably comprises a flexible polymer such as, for example, KAPTON™ polyimide (KAPTON is a trademark of DuPont Co.). In one embodiment, the flexible film has a thickness ranging from about 7.5 micrometers (0.3 mils) to about 125 micrometers (5 mils).

The flexible material 12 and 14 preferably comprises a flexible low modulus material, such as SPI/epoxy, other flexible epoxies, silicone rubber materials, MULTIPOSIT™ XP-9500 thermoset epoxy (MULTIPOSIT is a trademark of Shipley Company Inc., Marlborough, Mass.), TEFLON™ polytetrafluoroethylene (TEFLON is a trademark of DuPont Co.), porous polytetrafluoroethylene, or other polymers that have a low modulus or have been modified to obtain reduced modulus, having a thickness ranging from about 0.5 millimeters (20 mils) to about 1.250 millimeters (50 mils) depending on the application and the net differential stress to be accommodated. The flexible material provides a soft pliable interface to permit a later applied floating pad to move easily as CTE mismatches are accommodated.

The flexible material can be applied by spin coating, spray coating, film photodeposition, or roll coating, for example. The material can be patterned by photo-patterning techniques and/or masking, for example. As shown in FIG. 1, the flexible material can have either a uniform thickness (as shown by flexible material 12) or a varying thickness (as shown by flexible material 14). The tapered edges of flexible material 14 can be useful for reducing stress on surface metallization 16.

Surface metallization 16 can be formed by sputtering and/or plating, for example, either through a mask or over the entire surface followed by patterning with a standard photoresist and etch process. Eichelberger et al., U.S. Pat. No. 4,835,704, issued May 30, 1989, describes a useful adaptive lithography system for patterning the metallization, for example. The surface metallization in one embodiment comprises a thin adhesion layer of about 1000 Å to about 2000 Å sputtered titanium, coated by a thin layer of about 3000 Å to about 5000 Å sputtered copper, coated by a layer of electroplated copper to a thickness of about three microns to about ten microns, for example. The appropriate material of the surface metallization will vary depending on the material it is expected to contact and on the environment, such as a high temperature environment or an oxidizing environment for example, in which the electronic device will be used. If the surface metallization will be in contact with solder, preferably nickel and gold (with a thickness about 1000 Å to about 2000 Å) are applied over the electroplated copper. If the surface metallization will be in contact with a conductive polymer, titanium (with a thickness of about 1000 Å to about 2000 Å) is a useful material to apply over the copper.

Figure 2:
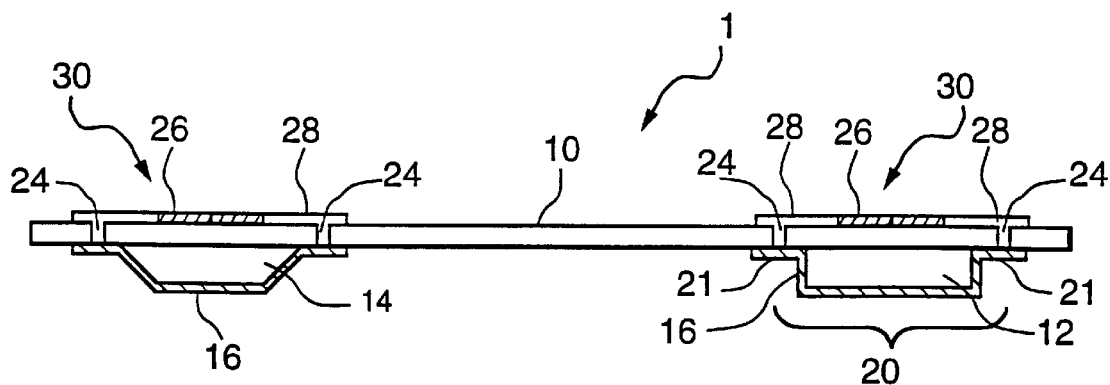
FIG. 2 is a view similar to that of FIG. 1 further including floating pad structures overlying the flexible film.

FIG. 2 is a view similar to that of FIG. 1 further including floating pad structures 30 overlying the flexible film 10 to form a flexible interface structure 1. Vias 24 are formed in flexible film 10 and extend to surface metallization 16 by any appropriate method. In one embodiment, as described in Eichelberger et al., U.S. Pat. No. 4,894,115, issued Jan. 16, 1990, the flexible film can be scanned repeatedly with a high energy continuous wave laser to create via holes of desired size and shape. Other appropriate methods include, for example, photopatterning photopatternable polyimides and using an excimer laser with a mask (not shown).

In a preferred embodiment, as shown in FIG. 2 surface metallization 16 has one portion 20 covering the flexible material and another portion 21 which extends to contact flexible film 10. In this embodiment, it is useful to have vias 24 extend to contact portion 21 of the surface metallization. Although this embodiment is preferred, the present invention can be practiced if the vias extend to portions of the surface metallization that are in contact with the flexible material.

Figure 3:
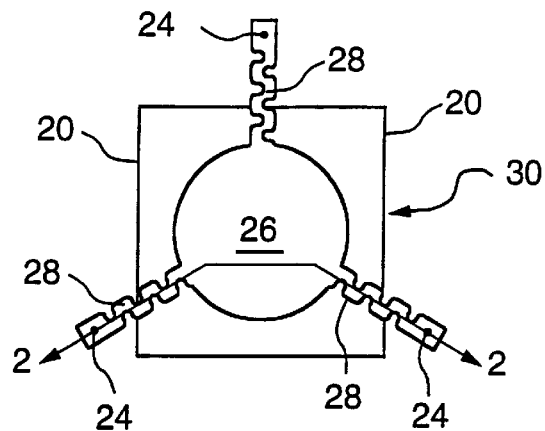
FIG. 3 is a top view of one of the patterned floating pad structures overlying a portion of the surface metallization.

FIG. 3 is a top view of one of patterned floating pad structures 30 overlying a portion 20 of surface metallization 16. Metallization for floating pad structures 30 can be applied and patterned by techniques similar to those discussed with respect to surface metallization 16 of FIG. 1. In FIGS. 2 and 3, the floating pad structures include a central pad 26 having patterned extensions 28 extending through vias 24 to surface metallization 16.

The size of central pads 26 will vary according to the specific planned use of the floating pad structure. For example, if a solder ball or solder bump will be attached directly to the central pad, the central pad must be large enough to accommodate the attachment.

As discussed in aforementioned U.S. application Ser. No. 08/781,972, now U.S. Pat. No. 5,900,674 the thickness of metallization for the floating pad structures can be uniform or variable (with the central pad being thicker than the extensions). In one embodiment, the extensions 28 have a thickness ranging from about 2 microns to about 8 microns, and the central pad 26 has a thickness ranging from about 2 microns to about 20 microns. This embodiment is useful because thin extensions are more flexible than thicker extensions whereas the central pad is preferably sufficiently thick for attachment to another electrically conductive surface. As discussed and shown in aforementioned U.S. application Ser. No. 08/781,972, now U.S. Pat. No. 5,900,674 any number of extensions (one or more) can be used, and the extensions can have any shape. Examples include straight extensions, serpentine shaped extensions, spiral extensions, saw-tooth extensions, bent extensions, pin-wheel shaped extensions, and extensions which extend to a ring which may in turn have additional extensions extending to another ring (not shown).

As further discussed and shown in aforementioned of U.S. application Ser. No. 08/781,972, now U.S. Pat. No. 5,900,674 a dip can intentionally be formed in the flexible film for reducing mechanical stress on extensions. The can be formed prior to, during, or after application of the flexible material by etching or by heat pressing, for example. If a dip is formed in the flexible film, extensions 28 will then have dips for stress relief. Additional metallization can be applied to the central pad if desired. Although not shown, the embodiments of FIGS. 2 and 4–6 are expected to have some natural (and beneficial) dips resulting from the application of the metallization of the floating pad structures even if dips are not intentionally formed.

Figure 4:
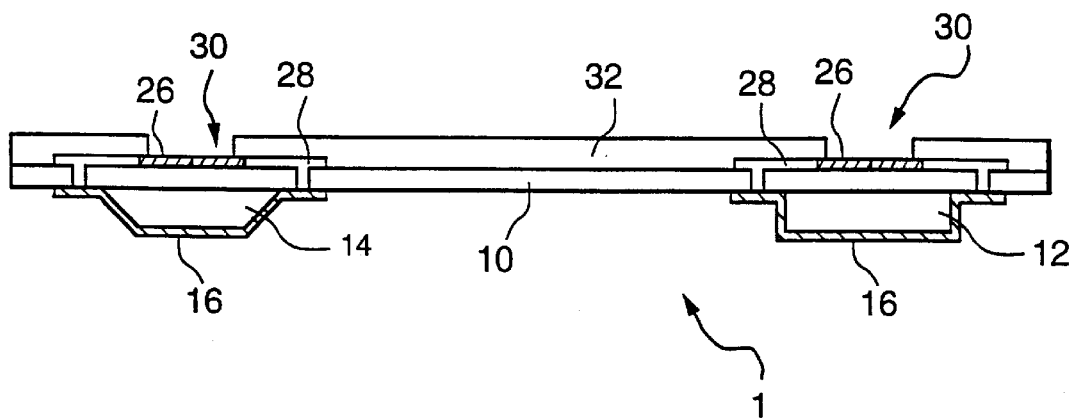
FIG. 4 is a view similar to that of FIG. 2 further showing an optional solder mask extending over the flexible film.

FIG. 4 is a view similar to that of FIG. 2 further showing an optional solder mask 32 extending over the flexible film. This mask is useful if central pad 26 is to be soldered to another conductive surface or pad for preventing solder leaching or solder run off onto extensions 28. The solder mask may comprise any material which is capable of masking solder. Examples include photopatternable epoxies that can be UV exposed and heat cured.

Figure 5:
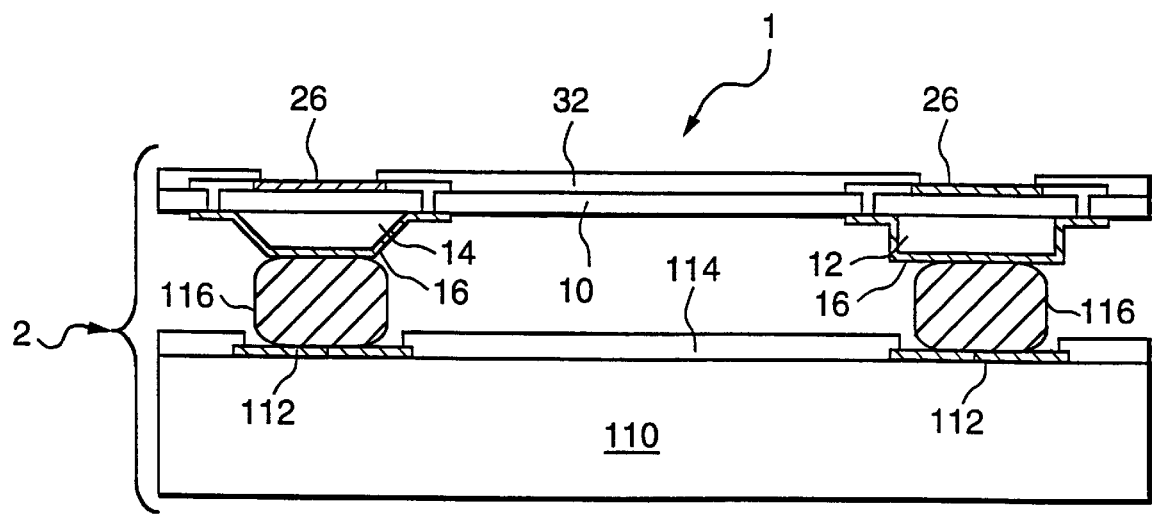
FIG. 5 is a view similar to that of FIG. 4 further showing attachment of the surface metallization to base pads through a solder ball and an epoxy ball.

FIG. 5 is a view similar to that of FIG. 4 further showing attachment of surface metallization 16 to base pads 112 through a conductive material 116. The conductive material may comprise a solder ball or a conductive polymer, for example. A base member 110 underlying base pads 112 may comprise a semiconductor wafer that has not yet been cut into segmented individual chips, a chip which has been segmented from a wafer, a passive component, a printed circuit (PC) board, a multi-chip module (MCM), a flexible interconnect layer structure such as described in Cole et al., U.S. Pat. No. 5,527,741, Jun. 18, 1996, or a substrate or wafer which may include photonic structures, liquid crystal structures, or microelectromechanical structures (MEMS) such as described in commonly assigned Ghezzo et al., U.S. Pat. No. 5,454,904, issued Oct. 3, 1995, for example. Base pads 112 may comprise pads or metallization on any of the above-discussed base members.

The flexible interface structure can be fabricated separately from the base member and later attached by the solder or by a conductive polymer such as a silver or a gold epoxy, for example. If solder is used, a solder mask 114 can be applied over the base member. If the base member comprises an MCM, a high temperature lead solder (such as 10 parts tin and 90 parts lead) is useful. If the base member comprises a PC board, a lower temperature solder (such as 37 parts tin and 63 parts lead) can be used.

Figure 6:
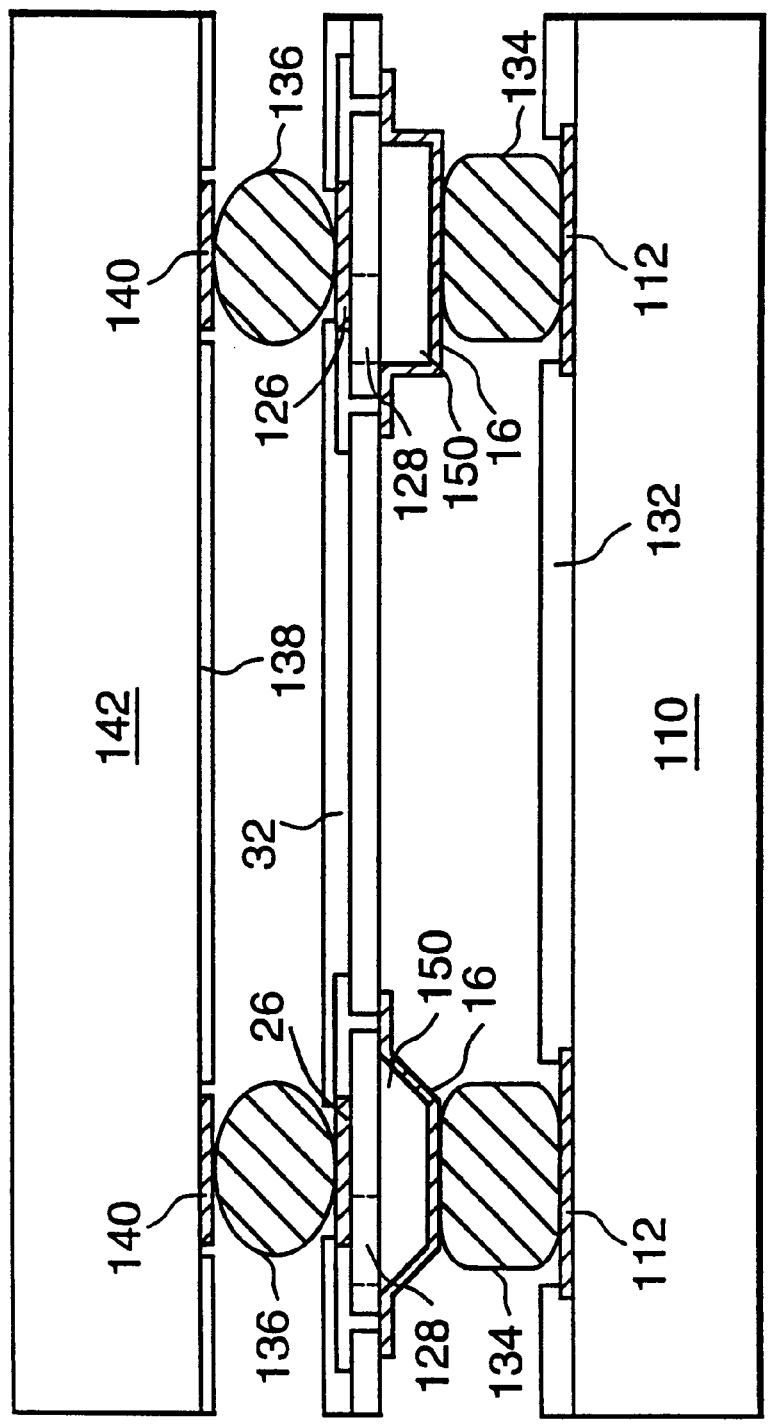
FIG. 6 is a view similar to that of FIG. 5 further showing attachment of the floating pad structures to conductive pads through a ball grid array.

FIG. 6 is a view similar to that of FIG. 5 further showing attachment of the floating pad structures 30 to mount pads 140 through a ball grid array 136 of a mount member 142. BGA solder balls 136 can be applied and solder can be reflowed to the floating pad structure. The mount member may comprise structures and devices similar to those of the base member. Examples of particularly useful mount members include flip chips, surface mount devices, ceramic filters, resistor assemblies, ceramic capacitors, MEMS, and large processor die that are fitted with solder pad (micro BGA) structures. If desired, surface metallization 16 of flexible interface structure can be patterned to fan out of micro BGA to a full sized BGA for positioning or for mechanical reasons. Many devices can be simultaneously attached to base member 110 using this device.

FIG. 6 further illustrates the removal of at least a portion of flexible film 10 and at least a portion of flexible material 12 and 14. If the flexible material is to be removed and if (as preferred) the surface metallization 16 surrounds the flexible material, at least a portion 128 of the flexible film (as well as any overlying solder mask, if applicable) will need to be removed from the surface adjacent the flexible material prior to removal of any flexible material. Preferably, no portion of the flexible film is removed from the areas under the central pad or the extensions.

In this embodiment, the material of the flexible film is preferably chosen to be a material that can be removed by a laser ablation or polymer ashing, for example, and the material of the flexible material is chosen to be a material that can be removed by a sublimation process or a solvent, for example, without interfering with the other materials to leave openings 150. Such partial removal of the flexible film and/or partial or total removal of the flexible material permits increased freedom of movement.

If desired, multiple levels of floating pads (not shown) can be used. Such additional layers are useful for providing greater stress accommodation when a single floating pad layer is not sufficient for extreme cases of thermal stress or strain. Multiple layer interface embodiments create additional thermal-mechanical isolation because the floating pad structures are farther away and provide a compound lever and thus more degrees of physical freedom.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for fabricating a flexible film interface comprising:

attaching a flexible material to a portion of a flexible film;

applying surface metallization on the flexible material;

forming at least one via through the flexible film extending to the surface metallization;

applying a floating pad structure comprising floating pad metallization patterned over the flexible material and the surface metallization, a first portion of the floating pad metallization forming a central pad and a second portion of the floating pad metallization forming at least one extension from the central pad and extending into the at least one via.

2. The method of claim 1 wherein applying surface metallization includes applying surface metallization on a portion of the flexible film, forming at least one via includes forming at least two vias extending to portions of the surface metallization which are in contact with the flexible film, and applying a floating pad structure includes patterning at least two extensions from the central pad each extending into a respective one of the at least two vias.

3. The method of claim 2 further including removing at least a first portion of the flexible film while leaving a second portion of the flexible film under the floating pad structure.

4. The method of claim 3 wherein removing at least a first portion of the flexible film includes forming an opening for providing access to the flexible material.

5. The method of claim 4 further including removing at least a portion of the flexible material.

6. The method of claim 5 wherein the flexible material comprises a low modulus polymer.

7. The method of claim 6 wherein removing at least a portion of the flexible material includes using a sublimation or a solvent process.

8. A method for fabricating a flexible film interface comprising:

attaching a flexible material to a portion of a flexible film;

applying surface metallization on the flexible material and on a portion of the flexible film;

forming at least two vias through the flexible film extending to the portions of the surface metallization which are in contact with the flexible film;

applying a floating pad structure comprising floating pad metallization patterned over the flexible material and the surface metallization, one portion of the floating pad metallization forming a central pad and other portions of the floating pad metallization forming at least two extensions from the central pad and each extending into a respective one of the at least two vias.

* * * * *